United States Patent [19]
Takeshima et al.

[11] Patent Number: 5,438,264
[45] Date of Patent: Aug. 1, 1995

[54] MAGNETIC FIELD GENERATING APPARATUS

[75] Inventors: Hirotaka Takeshima, Ryugasaki; Hiroyuki Takeuchi, Kashiwa; Chikako Nakamura, Matsudo, all of Japan

[73] Assignee: Hitachi Medical Corporation, Tokyo, Japan

[21] Appl. No.: 82,977

[22] Filed: Jun. 29, 1993

[30] Foreign Application Priority Data

Jun. 29, 1992 [JP] Japan .................................. 4-192709

[51] Int. Cl.6 .............................................. G01V 3/00
[52] U.S. Cl. ................................ 324/319; 324/320; 335/296
[58] Field of Search ............. 324/319, 320, 318, 322; 128/653.5; 335/296, 304, 306, 299

[56] References Cited

U.S. PATENT DOCUMENTS

| | | | |
|---|---|---|---|
| 4,679,022 | 7/1987 | Miyamoto et al. | 324/319 |
| 4,695,802 | 9/1987 | Zijlstra | 324/319 |
| 4,931,760 | 6/1990 | Yamaguchi et al. | 324/319 |
| 5,014,028 | 5/1991 | Leupold | 335/306 |
| 5,014,032 | 5/1991 | Aubert | 324/318 |
| 5,099,217 | 3/1992 | Leupold | 335/306 |
| 5,229,723 | 7/1993 | Sakurai et al. | 324/319 |

*Primary Examiner*—Louis Arana
*Attorney, Agent, or Firm*—Antonelli, Terry, Stout & Kraus

[57] ABSTRACT

A magnetic field generating apparatus has a hollow permanent magnet formed of a plurality of permanent magnet elements arranged to have a polygonal section. Magnetization directions of the end portions of the hollow permanent magnet in its longitudinal direction are made different from those of the central portion thereof so that the magnetic field generated in a predetermined region in the hollow space of the permanent magnet is increased as compared with a case where the magnetizations of the hollow permanent magnet are all directed in the same direction.

14 Claims, 7 Drawing Sheets

MAGNETIC FIELD GENERATING APPARATUS

BACKGROUND OF THE INVENTION

1. Field of the Invention

The present invention relates to a magnetic field generating apparatus. More particularly, it concerns a magnetic field generating apparatus of a permanent magnet type suitable to obtain an image of any of desired sections of a subject on the basis of the nuclear spin density information or relaxation time information thereof provided with use of nuclear magnetic resonance imaging (MRI) technology.

2. Description of the Prior Art

In order to generate the NMR phenomenon, required is a static magnetic field of spatially uniform strength in an unchanging direction with time. In order to measure in a spatially wide region, such as a human body, for example, requires a magnetic field generating apparatus that can generate the static magnetic field of 0.04 to 2 T (tesla equal to 10,000 gauss) with the uniformity below some 10 ppm in the measuring spherical region of 30 to 50 cm diameter. There are three types of magnetic field generating apparatus: normal conduction magnet, superconduction magnet, and permanent magnet types.

A previous magnetic field generating apparatus of permanent magnet type for the MRI apparatus has a hole-like space or a hollow space of a polygonal sectional shape surrounded by a plurality of permanent magnets as described in the Japanese Patent Application Laid-Open 62-177903. The central area of the hollow space has the object put therein and is made to generate the uniform static magnetic field.

The previous magnetic field generating apparatus is described below by reference to FIGS. 11 to 13. In FIG. 11, a yoke 1 is a member forming a magnetic circuit together with a permanent magnet 2, which is described below. The yoke 1 is formed of a soft magnetic material, such an iron plate or silicon steel plate, to a square cylinder shape. The yoke 1 has a pair of permanent magnet elements 21 and 22 arranged on an upper and lower inside walls thereof facing each other as shown in FIG. 12. The permanent magnet elements 21 and 22 serve for generating a main magnetic flux in a vertical direction to the inside walls as shown, each being formed, for example, like a plate having a trapezium section. The yoke 1 also has two pairs of permanent magnet elements 23 and 24 and 25 and 26 arranged on a right and left inside walls thereof facing each other as shown in the figures. These permanent magnet elements 23 to 26 serve for compensating for a uniformity of a magnetic field by the permanent magnet elements 21 and 22, each being formed, for example, like a plate having a scalene triangle section. Each of the permanent magnet elements 23 to 26 is stuck, for example, on its short-side surface to a corresponding slant of the permanent magnet elements 21 and 22. Thus, the plurality of permanent magnet elements 21 to 26 form a permanent magnet 2 having a polygonal section. The permanent magnet 2 forms a through-hole or hollow space 5 in which an object can enter and be surrounded by the permanent magnet elements. It should be noted that the permanent magnet elements 23 to 26 are symmetrically arranged vertically and horizontally around a center axis 6 of the permanent magnet 2. It should also be noted that each of the permanent magnet elements 23 to 26 is uniformly magnetized in a direction perpendicular to their respective boundary surfaces with the through-hollow space 5 as indicated by the respective arrows in FIG. 11. With the construction described above, a uniform static magnetic field 8 is generated, for example, vertically from bottom to top in a measuring region 7 of a central area of the through-hollow space 5.

With the construction of the previous magnetic field generating apparatus described above, as shown in FIG. 12, the magnetizations of the upper and lower magnet elements 21 and 22 are directed right upward as looked into away from an X-Y section. The magnetizations of the upper right and left side magnet elements 23 and 24 are obliquely directed outward. The magnetizations of the lower right and left side magnet elements 25 and 26 are obliquely directed inward. The magnetizations of the permanent magnet elements 21 to 26, as shown in FIG. 12, are all vertically directed perpendicular to the center axis 6 as looked into away from a Y-Z section. That is, the magnet elements 21 to 26 are all magnetized in the same direction at right angles to the center axis 6.

However, as the magnetic field generating apparatus for the MRI apparatus has to have the subject put in the through-hollow space 5 in the central area thereof, as shown in FIG. 13, the magnetic field generating apparatus has an opening 9 on each of both longitudinal ends of the permanent magnet 2 formed of the permanent magnet elements 21 to 26. For this reason, the magnetic field generated by the permanent magnet elements 21 to 26 extends out of the openings 9. This results in that the uniformity of the static magnetic field 8 is made worse in the measuring region 7 in the central area. Thus, the quality of the section image obtained is deteriorated. In order to prevent such a bad typical, it is effect to maker longer the depth-wise length of the permanent magnet elements 21 to 26 in the direction Z in FIG. 13. However, this measure involves an economic problem in that an amount of expensive permanent magnet material must be increased.

On the other hand, another type of previous magnetic field generating apparatus is proposed in the Japanese Patent Application Laid-Open 61-276308. This previous apparatus has some portions cut out of each of permanent magnets forming it. The portions are arranged at proper intervals in a longitudinal direction of the apparatus so that the uniform magnetic field can be obtained. However, there are gaps between the portions of the permanent magnets in the longitudinal direction. The gaps leak out the magnetic flux. This results in the problem in that the uniformity of the magnetic field strength is made worse in the measuring region in the central area.

Still another type of previous magnetic field generating apparatus is proposed in the Japanese Patent Application Laid-Open 2-83903. The apparatus, as shown in FIG. 14, has no yokes on the periphery, but a ring-like permanent magnet element group 10 arranged on the central portion and ring-like permanent magnet element groups 11 and 12 arranged on both sides. The permanent magnet element groups 11 and 12 arranged on both sides is made thicker than the permanent magnet element group 10 arranged on the central portion to improve the uniformity of the magnetic field. In this previous apparatus like the one in FIG. 13, the magnetizations of the permanent magnet element groups 10, 11, and 12 are all vertically directed perpendicular to a center axis 6'. However, the apparatus involves an economic problem that the amount of expensive permanent magnet material must be increased to obtain the fully uniform magnetic field in the measuring region in the central area inside the hollow area.

SUMMARY OF THE INVENTION

In view of the foregoing, it is an object of the present invention to provide a magnetic field generating apparatus suitable to increase a magnetic field strength in the three-dimensional region predetermined in a hollow space.

It is another object of the present invention to provide a magnetic field generating apparatus suitable to decrease the amount of permanent magnet material.

It is still another object of the present invention to provide a magnetic field generating apparatus suitable to increase a magnetic field strength in the three-dimensional region predetermined in a hollow space and to decrease the amount of permanent magnet material.

Briefly, the foregoing objects are accomplished in accordance with aspects of the present invention. The present invention provides a magnetic field generating apparatus comprising a permanent magnet having a hollow space portion extended in a longitudinal direction of the permanent magnet, the permanent magnet being for generating a uniform static magnetic field in a predetermined three-dimensional region of the hollow portion space and being magnetized differently in a direction in the longitudinal direction of the permanent magnet to thereby strengthen the static magnetic field as compared with a case where the permanent magnet is magnetized uniformly in a direction in the longitudinal direction thereof.

The foregoing and other objects, advantages, manner of operation and novel features of the present invention will be understood from the following detailed description when read in connection with the accompanying drawings.

DETAILED DESCRIPTION OF THE PREFERRED EMBODIMENT

The following describes in detail embodiments according to the present invention by reference to the accompanying drawings.

Figure 1:
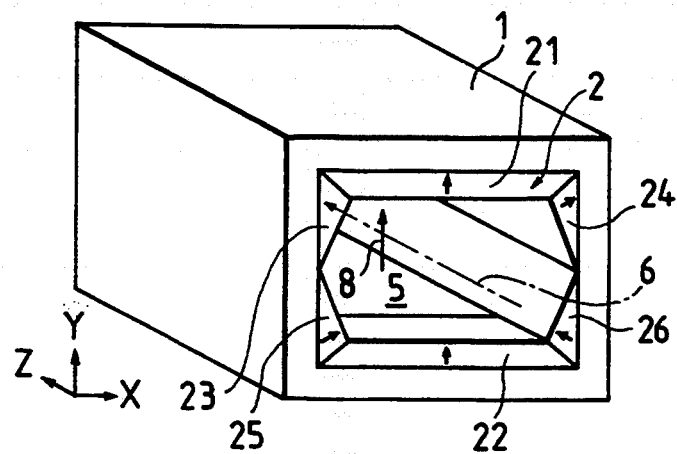
FIG. 1 depicts a perspective view of a first illustrative embodiment of the present invention for a magnetic field generating apparatus.
Figure 2:
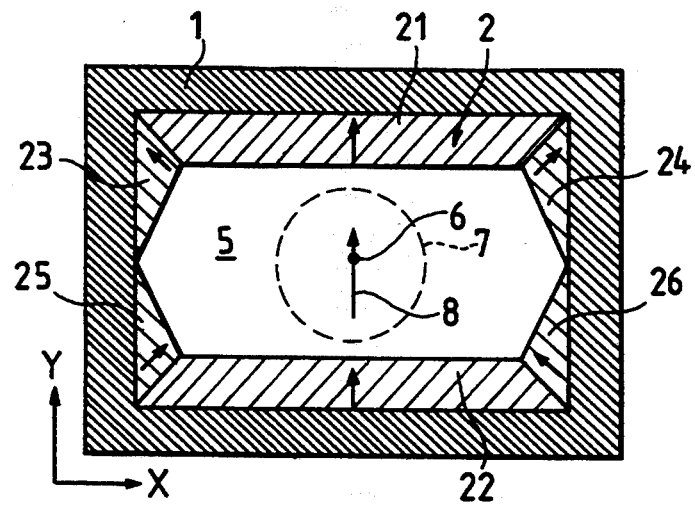
FIG. 2 depicts an X-Y section of a central area of the magnetic field generating apparatus in a Z axis direction in FIG. 1.
Figure 3:
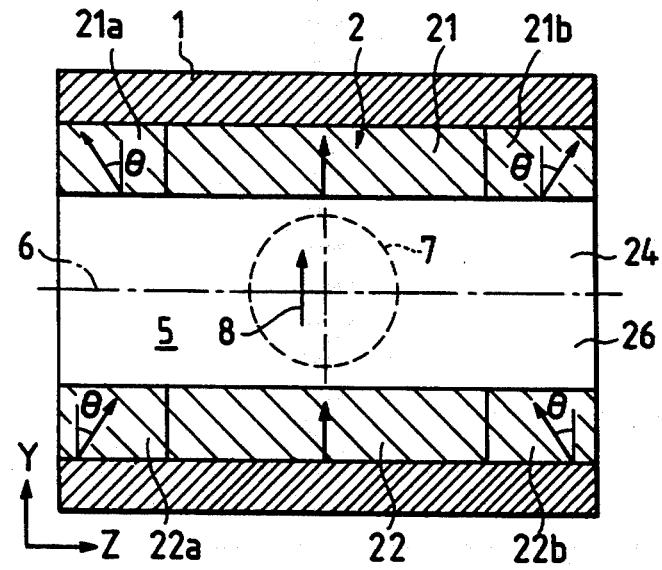
FIG. 3 depicts a Y-Z section of a central area of the magnetic field generating apparatus in a Y axis direction in FIG. 1.

FIGS. 1 to 3 are views illustrating a first embodiment of the present invention. In the figures, a yoke 1 is a member forming a magnetic circuit together with a permanent magnet 2, which is described below. The yoke 1 is formed of a soft magnetic material, such as iron plate or silicon steel plate, to a square cylinder shape. The yoke 1 has a pair of permanent magnet elements 21 and 22 arranged on an upper and lower inside walls thereof facing each other as shown in the figures. The permanent magnet elements 21 and 22 serve for generating a main magnetic flux in a vertical direction to the inside walls as shown, each being formed, for example, like a plate having a trapezium section.

The yoke 1 also has two pairs of permanent magnet elements 23 and 24 and 25 and 26 arranged on a right and left inside walls thereof facing each other as shown in the figures. These permanent magnet elements 23 to 26 serve for compensating for uniformity of a magnetic field by the permanent magnet elements 21 and 22, each being formed, for example, like a plate having a scalene triangle section. Each of the permanent magnet elements 23 to 26 is stuck, for example, on its short-side surface to a corresponding slant of the permanent magnet elements 21 and 22. Thus, the plurality of permanent magnet elements 21 to 26 form a permanent magnet 2 having a polygonal section. The permanent magnet 2 forms a through-hole or hollow space 5 in which an object can enter and be surrounded by the permanent magnet elements.

It should be noted that the permanent magnet elements 21 to 26 are symmetrically arranged vertically and horizontally around a center axis 6 of the permanent magnet 2. It should also be noted that each of the permanent magnet elements 21 to 26 is uniformly magnetized in a direction perpendicular to their respective boundary surfaces with the through-hollow space 5 as indicated by the respective arrows in FIG. 1. With the construction described above, a uniform static magnetic field 8 is generated, for example, vertically from bottom to top in a measuring region 7 of a central area of the through-hollow space 5.

In the present invention, the permanent magnet 2 formed with the plurality of permanent magnet elements 21 to 26 arranged has end permanent magnet elements 21a, 21b, 22a, and 22b positioned in the vicinity of openings in the longitudinal direction thereof. Each of the end permanent magnet elements 21a, 21b, 22a, and 22b are magnetized at respective predetermined inclined angles. That is, each of the upper end permanent magnet elements 21a and 21b and the lower end permanent magnet elements 22a and 22b is cut out to small blocks. Directions of magnetic fluxes of the lower small block end permanent magnet elements 22a and 22b positioned on a root side of the static magnetic field 8 are inclined inward at the predetermined angle $\theta(0° < \theta < 90°)$ with respect to the static magnetic field 8 which is perpendicular to the center axis 6 in the longitudinal direction of the permanent magnet 2 in the measuring region 7 in the central area of the through-hollow space 5 formed inside the permanent magnet 2. Directions of magnetic fluxes of the upper small block end permanent magnet elements 21a and 21b positioned on a head side of the static magnetic field 8, on the other hand, are inclined outward at the same predetermined angle $\theta$.

Figure 4A:
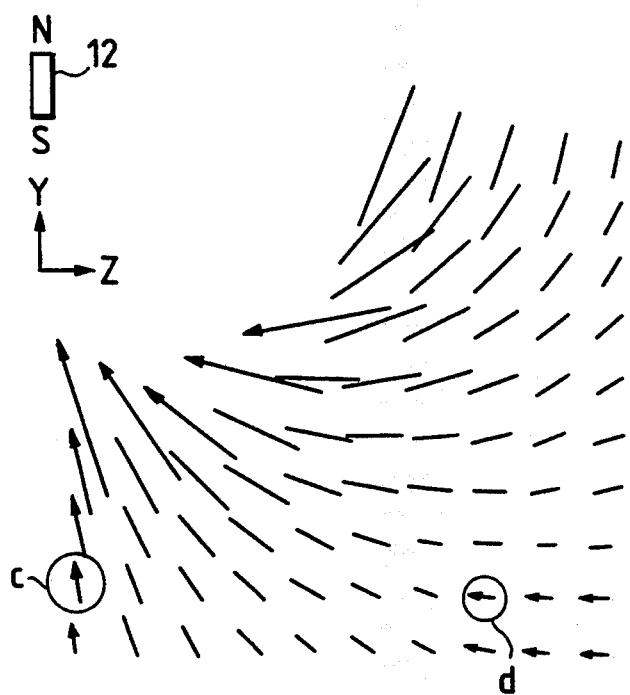
FIGS. 4(a) and 4(b) depict a magnetic line view illustrating reasons for inclining magnetizations of permanent magnets arranged in the vicinity of openings of the permanent magnets of the magnetic field generating apparatus.
Figure 13:
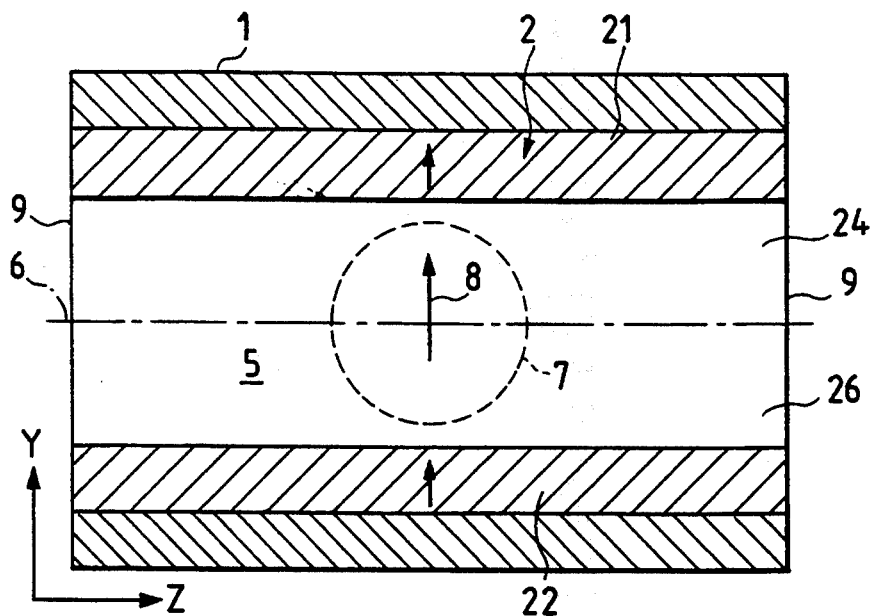
FIG. 13 depicts a Y-Z section of a central area of the magnetic field generating apparatus in an Y axis direction in FIG. 11.

The following describes why the directions of the magnetic fluxes of the small block end permanent magnet elements 21a and 21b and 22a and 22b are inclined. In general, a magnetic flux density generated by a permanent magnet is strongest in a direction of its magnetization. In the prior example shown in FIG. 13, the magnetizations of the end permanent magnet elements in the vicinity of the openings are vertically directed as the central area of the permanent magnets. The end portions only strengthen the magnetic fields in the vicinity of the openings, but will contribute a little to make stronger the magnetic field in the measuring region 7 in the center needed for actual shooting of the section image. This phenomenon is described below by reference to FIG. 4. If a bar permanent magnet 12 is vertically placed in parallel to an axis Y, as shown in FIG. 4(a), a magnetic field vector in a region just below the permanent magnet 12, for example, in a circle c, is almost along the axis Y. Another magnetic field vector at a far position in a horizontal Z axis direction, for example, in a circle d, however, is decreased in its component in the axis Y direction, while being increased in its component in the axis Z direction. This means that the permanent magnet 12 does not contribute to increase the magnetic field in the measuring region 7 in the central area.

Figure 4B:
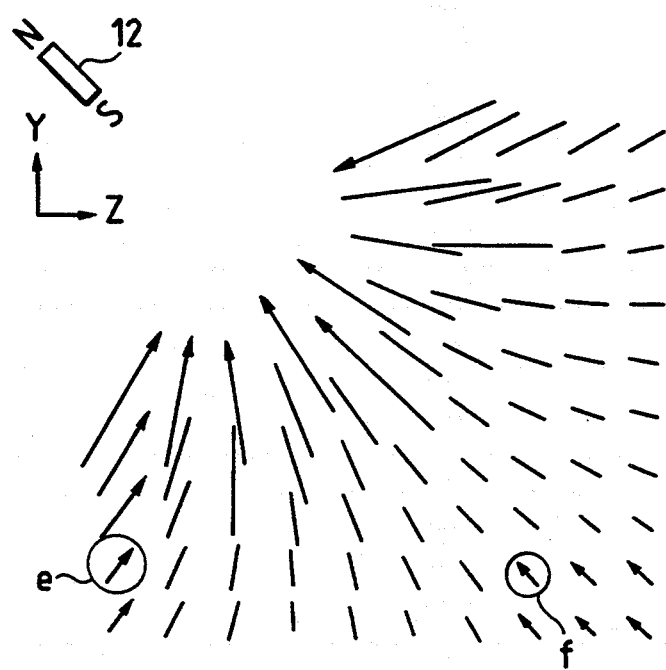

On the other hand, if the bar permanent magnet 12 is inclined at an angle from the axis Y, as shown in FIG. 4(b), the magnetic field vector in the region just below the permanent magnet 12, for example, in a circle e, is decreased in its component in the axis Y direction, while being increased in its component in the axis Z direction, as compared with the one in FIG. 4(a). But, the other magnetic field vector at the far position in the horizontal Z axis direction, for example, in a circle f, however, is increased in its component in the axis Y direction, while being decreased in its component in the axis Z direction as compared with the one in FIG. 4(a). This provides the effect that the increase of the axis Y direction component of the magnetic field vector in the circle f in FIG. 4(b) can make stronger the magnetic field of the static magnetic field 8 in the measuring region 7 in the central area distant from the opening. The effect is due to the fact that in the construction of the present invention shown in FIG. 3, the magnetization direction, for example, of the corresponding small block-like end permanent magnet element 21a positioned at the left of the upper permanent magnet element 21 is inclined by the angle from the axis Y. This applies to all the other small block-like end permanent magnet elements 21b, 22a, and 22b in FIG. 3.

Figure 5:
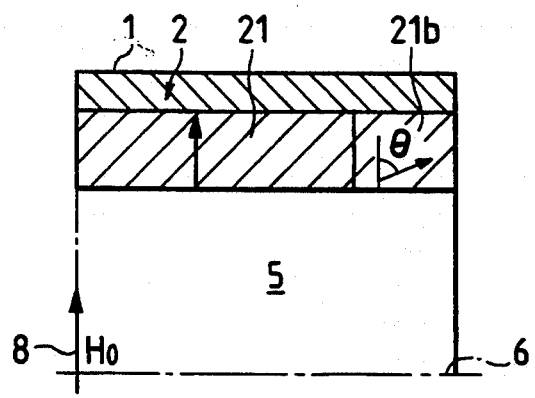
FIG. 5 depicts a partly cross-sectional view illustrating an upper right portion extracted from the magnetic field generating apparatus shown in FIG. 3.
Figure 6:
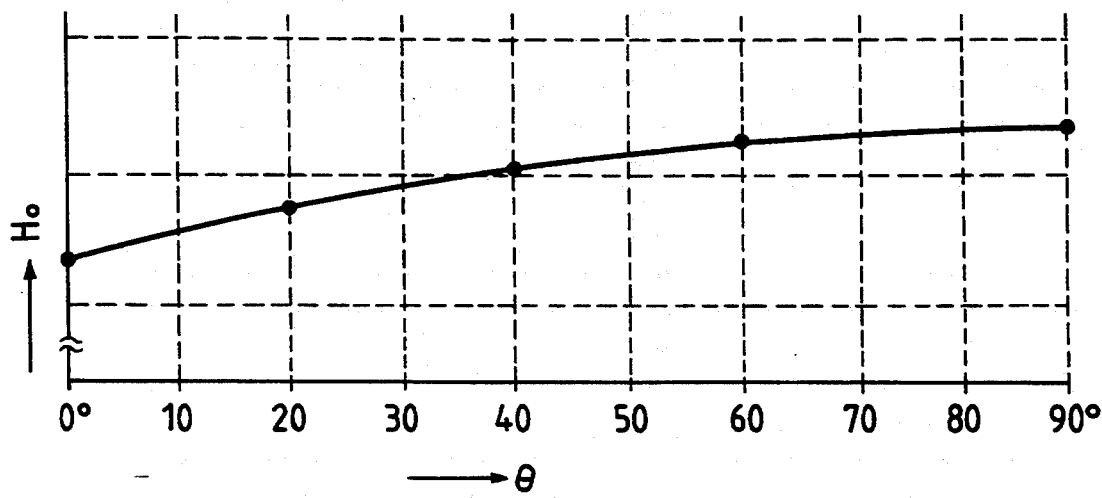
FIG. 6 depicts a graph of a magnetic field strength $H_0$ in the central area to a magnetization direction angle $\theta$ of an end permanent magnet element shown in FIG. 5.

The magnetic field strength in the measuring region 7 in the central area of the through-hollow space 5 is related with the inclination angle $\theta$ of the other small block-like end permanent magnet elements 21a, 21b, 22a, and 22b in the construction in FIG. 3. The relationship can be easily obtained by way of a computer simulation, such as the finite-state element method or the magnetic moment method. FIG. 5 is a cross-sectional view illustrating an upper right portion extracted from the magnetic field generating apparatus shown in FIG. 3. FIG. 6 is a graph of results obtained by calculation of the magnetic field strength $H_0$ in the center axis 6 of the through-hollow space 5 of the small block-like end permanent magnet element 21b positioned in the vicinity of the opening the magnetization direction of which is inclined by the angle $\theta$ from a direction perpendicular to the center axis 6. In the graph in FIG. 6, an axis of abscissas is a change of the angle $\theta$ to which the magnetization direction is inclined, and an axis of ordinates is a relative value of the magnetic field strength $H_0$ in the central area corresponding to the inclination angle $\theta$. The magnetic field strength $H_0$ at $\theta = 0°$ is the one for the construction of the prior example shown in FIG. 13. We can see that in the construction of the present invention, the magnetic field strength $H_0$ in the central area increases with the angle $\theta$. It should be noted that a rate of increment of the magnetic field strength $H_0$ is determined in terms of various parameters, including a desired magnetic field strength $H_0$, a material used for the permanent magnets, a depth of the apparatus, and an aperture of the openings.

Figure 7:
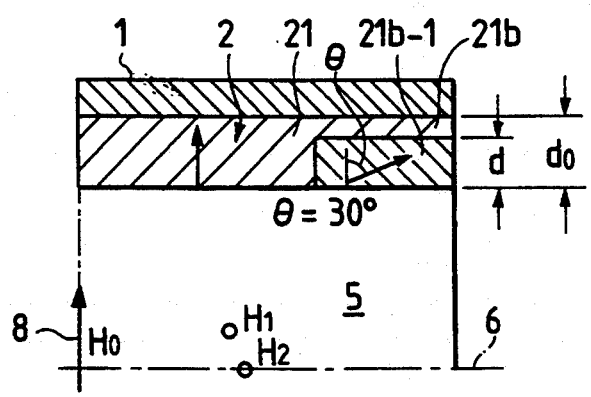
FIG. 7 depicts a partly cross-sectional view of a second illustrative embodiment of the present invention, corresponding to FIG. 5.
Figure 8:
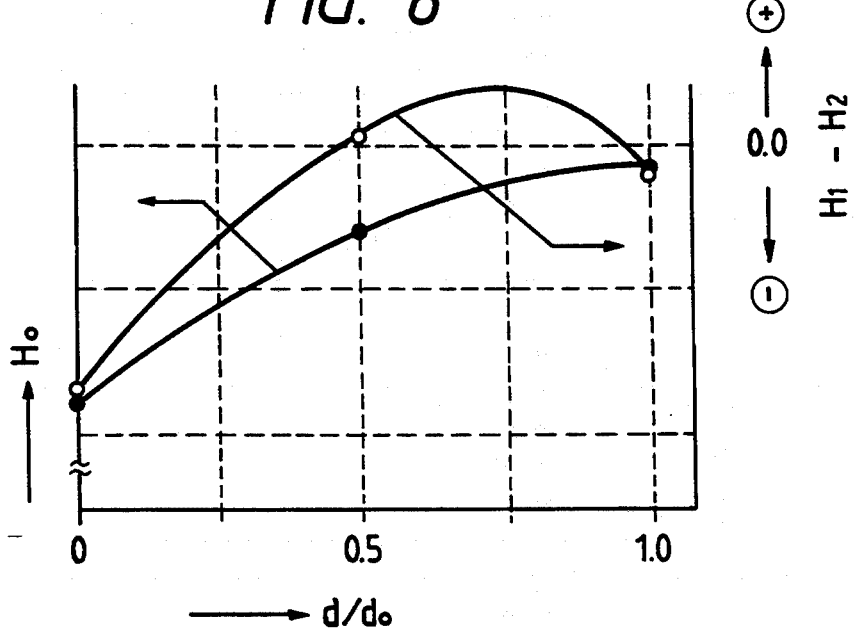
FIG. 8 depicts a graph of a magnetic field strength $H_0$ in the central area to a thickness ratio $d/d_0$ of an end permanent magnet element shown in FIG. 7.

FIG. 7 is a longitudinal view partly in section illustrating a second embodiment of the present invention. The figure illustrates the upper right portion extracted from the magnetic field generating apparatus shown in FIG. 3. In the second embodiment, one of the end permanent magnet elements positioned in the vicinity of the openings in FIG. 3 is halved in its thickness direction. The portion positioned to the through-hollow space 5 is made of a small block-like end permanent magnet element 21b-1. A magnetization of the end permanent magnet element 21b-1 is inclined by an angle in a predetermined direction. In FIG. 7, the whole thickness of the end permanent magnet element 21b is denoted by $d_0$, and thickness of the end permanent magnet element 21b-1 is denoted by d, where $d < d_0$. FIG. 8 is a graph of results of the magnetic field strength $H_0$ obtained by way of the computer simulation at the center if the whole thickness d is changed in reference to the thickness $d_0$. In the graph in FIG. 8, an axis of abscissas is a change of a ratio $d/d_0$ of the whole thickness d to the thickness $d_0$ of the end permanent magnet element 21b-1 the magnetization of which is inclined, and an axis of ordinates is a relative value of the magnetic field strength $H_0$ in the central area. The inclination angle of the magnetization of the small block-like end permanent magnet element 21b-1, as shown in FIG. 7, is made constant at 30°, and its length also is made constant. The calculation results are shown by black circles and a solid curve in FIG. 8. We can see that the magnetic field strength $H_0$ in the center increases with the thickness d of the end permanent magnet element 21b-1.

However, for the magnetic field generating apparatus having the yoke 1 used as shown in FIGS. 3 and 7, the uniformity of the magnetic field tends to become worse if the end permanent magnet element 21b-1 the magnetization of which is inclined is made thicker than a certain thickness. The reason would be that if the thickness d is too high, the magnetic flux generated by the end permanent magnet element 21b-1 close to the yoke 1 is absorbed by the yoke 1. This results in that the magnetic field strength is locally decreased in the region where the uniformity is needed. That is, as shown in FIG. 6, a difference, $H_1-H_2$, between the magnetic field strengths $H_1$ and $H_2$ at two points close to each other in the vicinity of the center axis 6 becomes large. In general, in order to accomplish a highly uniform magnetic field, the difference, $H_1-H_2$, must be negative at the stage of design because the uniformity in the region cannot easily be adjusted. FIG. 8 shows calculated results of the difference by white circles and a solid curve, with a right-hand axis of ordinates takes the difference, $H_1-H_2$, of the magnetic field strengths. The curve shows a relationship between the thickness d of the end permanent magnet element 21b-1 and the magnetic field uniformity in such a condition. From the results, we can find the magnetic field uniformity becomes worse as the difference, $H_1-H_2$, becomes greater than 0 if the thickness d of the small block-like end permanent magnet element 21b-1 becomes thicker than the certain value. For the reason, the thickness d of the end permanent magnet element 21b-1 should be determined so that the thickness ratio $d/d_0$ should be, for example, less than 0.5.

Figure 9:
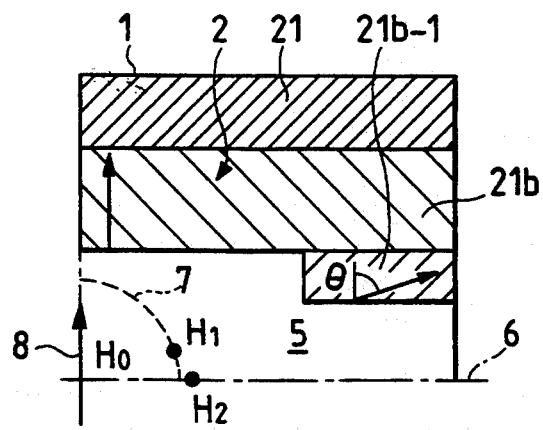
FIG. 9 depicts a partly cross-sectional view of a third illustrative embodiment of the present invention, corresponding to FIG. 5.
Figure 10:
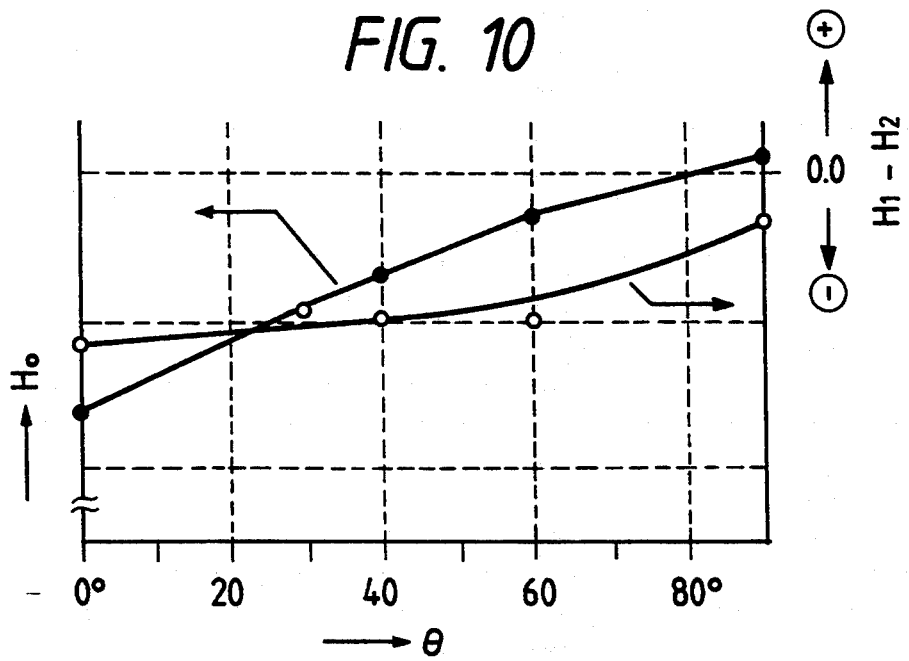
FIG. 10 depicts a graph of a magnetic field strength $H_0$ in the central area to a to a magnetization direction angle of an end permanent magnet element shown in FIG. 9.

FIG. 9 is a longitudinal view partly in section illustrating a third embodiment of the present invention. The figure illustrates the upper right portion extracted from the magnetic field generating apparatus shown in FIG. 3. In the third embodiment, the end permanent magnet elements 21b-1 positioned in the vicinity of the openings in FIG. 3 is projected inside the through-hollow space 5. A magnetization of the end permanent magnet element 21b-1 is inclined by an angle $\theta$ in a predetermined direction. In the third embodiment, it is possible to control the difference, $H_1-H_2$, between the magnetic field strengths $H_1$ and $H_2$ at two points close to each other around the axis Z direction (horizontal direction) in the measuring region 7 in the central area of the through-hollow space 5. FIG. 10 is a graph of results obtained by way of computer simulation to see an effect due to the inclination of the magnetization of the end permanent magnet element 21b-1 projected inside the through-hollow space 5 in the vicinity of the opening. The graph shows a change of the magnetic field strength $H_0$ in the central area of the through-hollow space 5 and a change of a difference, $H_1-H_2$, between the magnetic field strengths $H_1$ and $H_2$ at the two points with the inclination angle of the magnetization direction from 0° to 90°, with the thickness and the length of the end permanent magnet element 21b-1 made constant. In the graph in FIG. 10, an axis of abscissas is the change of the inclination angle $\theta$ of the magnetization direction, and an axis of ordinates is a relative value of the magnetic field strength $H_0$ in the central area, with a right-hand axis of ordinates that takes the difference, $H_1-H_2$, of the magnetic field strengths. The calculation results of the magnetic field strength $H_1$ are shown by black circles and a solid curve, and the calculated results of the difference, $H_1-H_2$, by white circles and a solid curve. We can see in FIG. 10 that the magnetic field strength $H_0$ in the central area increases with the inclination angle of the magnetization direction. The uniformity of the magnetic field, or the difference, $H_1-H_2$, of the magnetic field strengths, however, becomes worse. We, therefore, have to obtain an optimum inclination angle with the both characteristics in FIG. 10 taken into account.

Figure 11:
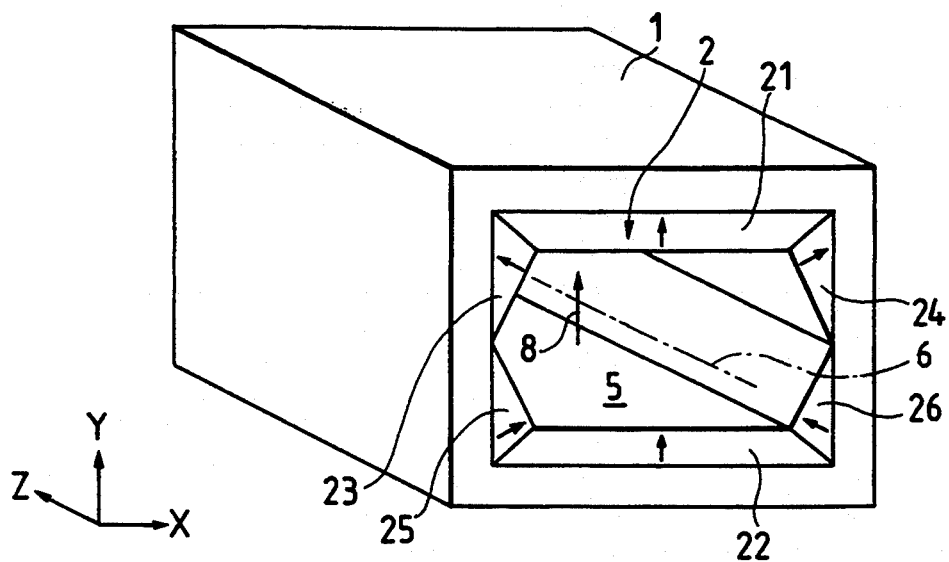
FIG. 11 depicts a perspective view of an embodiment of a previous magnetic field generating apparatus.
Figure 12:
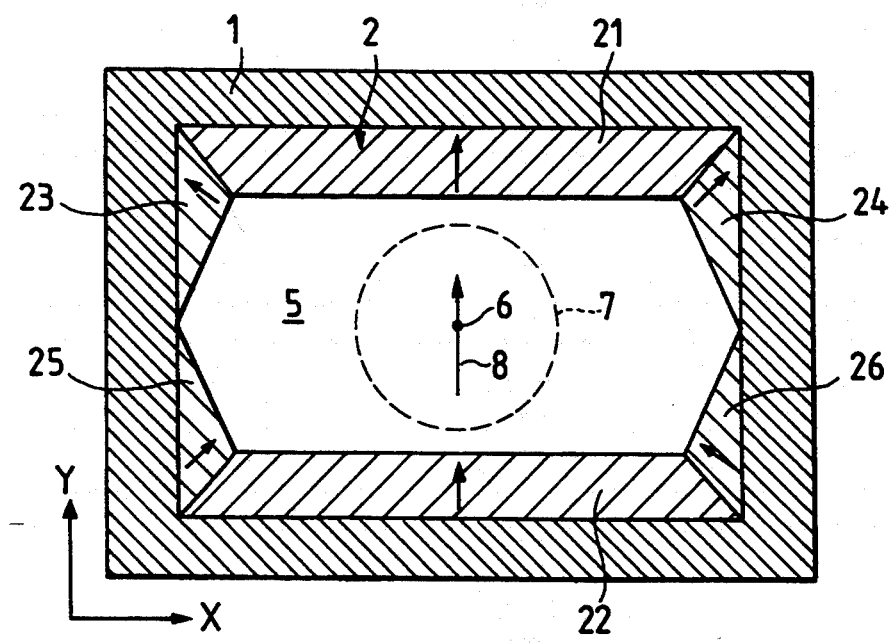
FIG. 12 depicts an X-Y section of a central area of the magnetic field generating apparatus in a Z axis direction in FIG. 11.

In the description so far by reference to FIGS. 3, 5, 7, and 9, each of the embodiments of the present invention is featured in the inclination of the magnetization direction of the permanent magnet element positioned at both ends of the permanent magnet elements 21 and 22 arranged above and below the through-hollow space 5, respectively. The present invention is not limited to that. In addition, we can incline the magnetization directions of the permanent magnet elements 23 to 26 arranged on the right and left side walls in FIG. 11. This can further increase the magnetic field strength $H_0$ in the central area.

In the embodiments described above, the magnetization of the small block-like end permanent magnet elements positioned in the vicinity of the openings are all inclined at the same angle $\theta$. The present invention is not limited to that. In addition, we can obtain a different optimum angle depending on the position and size of each small block-like end permanent magnet element, that is, the upper or lower, right or left, length, and thickness. Each of the small block-like end permanent magnet elements then should be inclined at the respective optimum angles.

Figure 14:
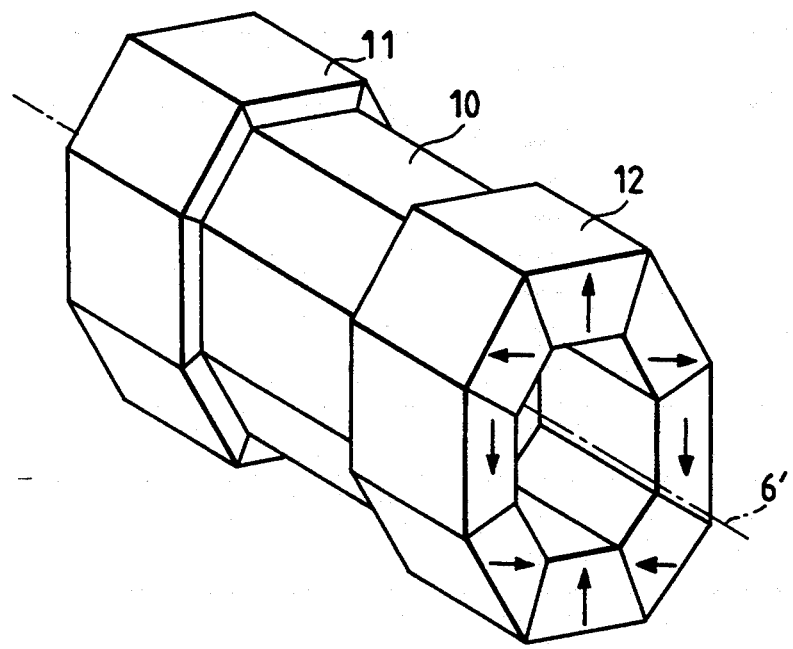
FIG. 14 depicts a perspective view of an embodiment of another previous magnetic field generating apparatus.

In the embodiments described above, the yoke 1 is arranged on the outside the apparatus as shown in FIG. 3. The present invention can be applied to the previous magnetic field generating apparatus explained in the "Description of the Prior Art" section by reference to FIG. 14. The apparatus has no yokes on the periphery, but a ring-like permanent magnet group 10 arranged on the central portion and ring-like permanent magnet groups 11 and 12 arranged on both sides.

The embodiments of the present invention described so far provide an effect that the magnetic field strength in the central area of the hollow space in which the subject is put in can be increased. The effect is accomplished in the way that the magnetic directions of the permanent magnet element arranged in the vicinity of the openings in the longitudinal direction of the hollow permanent magnet having the plurality of permanent magnet elements arranged are inclined to their respective optimum angles in their respective optimum directions. The effect can increase the quality of the image obtained. The effect also can decrease the amount of the permanent magnet material used.

In addition, with the embodiment shown in FIG. 9 in which the small block-like end permanent magnet elements are arranged to project inside the hollow space of the permanent magnet element arranged in the vicinity of the openings and in which the magnetization directions of the small block-like end permanent magnet elements are inclined to their respective optimum angles in their respective optimum directions, it is possible to control the difference of the magnetic field strengths around the horizontal axis in the measuring area in the central area of the hollow space. This feature is effective to increase the uniformity of the magnetic field around the horizontal axis. Thus, the apparatus of the present invention can generate the strong, uniform static magnetic field in the wide area in the hollow space.

It is to be understood that the form of the present invention herewith shown and described is to be taken as preferred embodiments. Various changes may be made in the shape, size and arrangement of parts. It is intended, therefore, that all matter contained in the foregoing description and in the drawings shall be interpreted as illustrative only not as limitative of the present invention, without departing from the spirit of scope of the present invention as defined in the subjoined claims.

What is claimed is:

1. A magnetic field producing apparatus comprising a permanent magnet having a hole-like space portion extended in a longitudinal direction of the permanent magnet, the permanent magnet being for producing a uniform static magnetic field in a predetermined three-dimensional region of the hole-like space portion and comprising permanent magnet portions having magnetization directions tilted at an angle between, and not including, 0° and 90° in said longitudinal direction, to thereby strengthen the static magnetic field as compared with a case where the permanent magnet has magnetization directions provided uniformly along the longitudinal direction thereof.

2. A magnetic field producing apparatus comprising a permanent magnet having a hole-like space portion extended in a longitudinal direction of the permanent magnet, the permanent magnet being for producing a uniform static magnetic field in a predetermined three-dimensional region of the hole-like space portion and being so magnetized as to make a magnetization direction of a first portion of the permanent magnet in the longitudinal direction thereof different from a magnetization direction of a second portion of the permanent magnet by having said first portion have a magnetization direction tilted at an angle between, and not including, 0° and 90° in said longitudinal direction, to thereby strengthen the uniform static magnetic field as compared with a case where the permanent magnet has magnetization directions provided uniformly along the longitudinal direction thereof.

3. A magnetic field producing apparatus comprising a permanent magnet having a through hole-like space portion extended in a longitudinal direction of the permanent magnet, the permanent magnet being for producing in a central region of the through hole-like space portion a uniform magnetic field directed from a first permanent magnet portion to a second permanent magnet portion of the permanent magnet which are provided opposite to each other with respect to the longitudinal axis of the permanent magnet, and being so magnetized as to make a magnetization direction of each longitudinal end portion of each of said first permanent magnet portion and said second permanent magnet portion different from that of a magnetization direction of a central portion of each of said first permanent magnet portion and said second permanent magnet portion by having said each longitudinal end portion have a magnetization direction tilted at an angle between, and not including. 0° and 90° in said longitudinal direction, to thereby strengthen the static magnetic field as compared with a case where the permanent magnet has magnetization directions provided uniformly along the longitudinal direction thereof.

4. A magnetic field producing apparatus according to claim 3, wherein the magnetization direction of each end portion of said first permanent magnet portion is tilted so as to be directed from the outside of the permanent magnet to the inside thereof with respect to the direction of the static magnetic field and the magnetization direction of each end portion of said second permanent magnet portion is tilted so as to be directed from the inside of the permanent magnet to the outside thereof with respect to the direction of the static magnetic field.

5. A magnetic field producing apparatus according to claim 3, wherein the magnetization direction of each end portion of said first permanent magnet portion is tilted by a predetermined angle in a direction which is directed from the outside of the permanent magnet to the inside thereof with respect to the direction of the static magnetic field and the magnetization direction of each of the end portions of said second permanent magnet portion is tilted in a direction by the predetermined angle in a direction which is directed from the inside of the permanent magnet to the outside thereof with respect to the direction of the static magnetic field.

6. A magnetic field producing apparatus comprising a permanent magnet having a through hole-like space portion extended in the direction of a longitudinal center axis of the permanent magnet, the permanent magnet including first and second permanent magnet elements disposed opposite to each other with respect to the longitudinal center axis of the permanent magnet, the permanent magnet being for producing a uniform static magnetic field in a predetermined three-dimensional region of the through hole-like space portion and comprising permanent magnet portions having magnetization directions tilted at an angle between, and not including, 0° and 90° in said longitudinal direction, to thereby strengthen the static magnetic field as compared with a case where the permanent magnet has magnetization directions provided uniformly along the longitudinal center axis thereof.

7. A magnetic field producing apparatus comprising a permanent magnet having a through hole-like space portion extended in the direction of a longitudinal center axis of the permanent magnet, the permanent magnet including a first permanent magnet element and a second permanent magnet element disposed opposite to each other with respect to the longitudinal center axis of the permanent magnet, the permanent magnet being for producing in a predetermined three-dimensional region of the through hole-like space portion a uniform static magnetic field in a direction which is directed from said first permanent magnet element to said second permanent magnet element and being so magnetized as to make a magnetization direction of each end portion of each said first permanent magnet element and said second permanent magnet element different from a magnetization direction of each central portion of each of said first permanent magnet element and said second permanent magnet element by having said each end portion have a magnetization direction tilted at an angle between, and not including, 0° and 90° in said longitudinal direction, to thereby strengthen the static magnetic field as compared with a case where the permanent magnet has magnetization directions provided uniformly along the longitudinal direction thereof.

8. A magnetic field producing apparatus according to claim 7, wherein the magnetization direction of each end portion of said first permanent magnet element is tilted so as to be directed from outside of the permanent magnet to the inside thereof with respect to the static magnetic field and the magnetization direction of each end portion of said second permanent magnet element is tilted so as to be directed from the inside of the permanent magnet to the outside thereof with respect to the static magnetic field.

9. A magnetic field producing apparatus according to claim 7, wherein the magnetization direction of each end portion of said first permanent magnet element is tilted by a predetermined angle in a direction which is directed from the outside of the permanent magnet to the inside thereof with respect to the static magnetic field and the magnetization direction of each end portion of said second permanent magnet element is tilted by the predetermined angle in a direction which is directed from the inside of the permanent magnet to the outside thereof with respect to the static magnetic field.

10. A magnetic field producing apparatus according to claim 8 or 9, wherein each of the end portions of said first permanent magnet element and said second permanent magnet element is divided into first and second end permanent magnet elements with respect to the direction of the static magnetic field, said first end permanent magnet elements being disposed adjacent to said second end permanent magnet elements with respect to the direction of the static magnetic field, respectively, said first end permanent magnet elements having magnetization directions which are substantially the same as magnetization directions of central portions of said first permanent magnet element and said second permanent magnet element.

11. A magnetic field producing apparatus according to claim 10, wherein said second end permanent magnet elements are wholly disposed in the through hole-like space portion in contact with said first end permanent magnet elements.

12. A magnetic field producing apparatus according to claim 8 or 9, wherein each of the end portions of said first permanent magnet element and said second permanent magnet element comprises separate permanent magnet elements disposed adjacent to a main body portion of said first permanent magnet element and said second permanent magnet element, respectively, with respect to a direction of the static magnetic field.

13. A magnetic field producing apparatus according to claim 12, wherein said separate permanent magnet elements are wholly disposed in the through hole-like space portion in contact with said first end permanent magnet elements.

14. A magnetic field producing apparatus according to claim 8 or 9, wherein each of the end portions of said first permanent magnet element and said second permanent magnet element comprises separate permanent magnet elements disposed adjacent to a main body portion of said first permanent magnet element and said second permanent magnet element, respectively, with respect to a direction of said longitudinal center axis.

* * * * *